US010539867B2

(12) United States Patent
Kirkpatrick et al.

(10) Patent No.: US 10,539,867 B2
(45) Date of Patent: Jan. 21, 2020

(54) FILM AND METHODS OF FORMING SAME

(71) Applicants: Exogenesis Corporation, Billerica, MA (US); Sean R. Kirkpatrick, Littleton, MA (US); Son T. Chau, Lynn, MA (US)

(72) Inventors: Sean R. Kirkpatrick, Littleton, MA (US); Son T. Chau, Lynn, MA (US)

(73) Assignee: Exogenesis Corporation, Billerica, MA (US)

( * ) Notice: Subject to any disclaimer, the term of this patent is extended or adjusted under 35 U.S.C. 154(b) by 253 days.

(21) Appl. No.: 14/892,284

(22) PCT Filed: May 21, 2014

(86) PCT No.: PCT/US2014/039011
§ 371 (c)(1),
(2) Date: Nov. 19, 2015

(87) PCT Pub. No.: WO2014/190077
PCT Pub. Date: Nov. 27, 2014

(65) Prior Publication Data
US 2016/0091787 A1 Mar. 31, 2016

Related U.S. Application Data

(60) Provisional application No. 61/825,910, filed on May 21, 2013, provisional application No. 61/865,664, (Continued)

(51) Int. Cl.
*G03F 1/62* (2012.01)
*B29C 39/20* (2006.01)
(Continued)

(52) U.S. Cl.
CPC .............. *G03F 1/62* (2013.01); *B29C 39/203* (2013.01); *B29C 59/00* (2013.01);
(Continued)

(58) Field of Classification Search
CPC ......... G03F 1/62; B29C 39/203; B29C 59/00; B29C 47/0021; B29C 35/08
See application file for complete search history.

(56) References Cited

U.S. PATENT DOCUMENTS 4,291,116 A * 9/1981 Tibbetts .................... G03F 7/12
430/271.1
4,698,285 A * 10/1987 Ehrfeld ..................... G03F 1/22
205/122
(Continued)

OTHER PUBLICATIONS

International Search Report dated Sep. 30, 2014 for International Application No. PCT/US14/39011.

*Primary Examiner* — Stella K Yi
(74) *Attorney, Agent, or Firm* — Burns & Levinson LLP; Jerry Cohen; David W. Gomes

(57) ABSTRACT

A film and method of forming a film provides an unmodified starting layer of a starting material, the starting layer having opposed first and second surfaces and an initial thickness, $T_1$, and a modified surface layer of thickness $T_2$ which is less than $T_1$, formed in at least a portion of the second surface, wherein a portion of the modified surface layer is not supported by unmodified starting material removed from the first surface opposite the modified surface layer.

14 Claims, 9 Drawing Sheets

Related U.S. Application Data filed on Aug. 14, 2013, provisional application No. 61/867,660, filed on Aug. 20, 2013.

(51) Int. Cl.
*B29C 59/00* (2006.01)
*B29K 25/00* (2006.01)
*B29K 83/00* (2006.01)
*B29L 7/00* (2006.01)

(52) U.S. Cl.
CPC ...... *B29K 2025/00* (2013.01); *B29K 2083/00* (2013.01); *B29L 2007/008* (2013.01)

(56) References Cited

U.S. PATENT DOCUMENTS

| | | | |
|---|---|---|---|
| 4,948,706 A | * | 8/1990 | Sugihara ........... G02F 1/133512 |
| | | | 216/101 |
| 6,300,631 B1 | | 10/2001 | Shofner |
| 2009/0065708 A1 | | 3/2009 | Moon et al. |
| 2009/0104544 A1 | | 4/2009 | Kubota et al. |
| 2012/0045615 A1 | | 2/2012 | Kirkpatrick et al. |
| 2013/0059449 A1 | | 3/2013 | Hautala |
| 2013/0112613 A1 | | 5/2013 | Kang et al. |

* cited by examiner

Sectional View B-B

FILM AND METHODS OF FORMING SAME

CROSS-REFERENCE TO RELATED APPLICATIONS

This application is a U.S. national stage application under 35 U.S.C. 371 of co-pending International Application No. PCT/US14/39011, filed on May 21, 2014, and entitled FILM AND METHODS OF FORMING SAME, which in turn claims priority to and benefit of U.S. Provisional Patent Application Nos. 61/825,910, filed on May 21, 2013, 61/865,664, filed on Aug. 14, 2013, and 61/867,660, filed on Aug. 20, 2013, all of which are incorporated by reference herein in their entirety for all purposes.

FIELD OF THE INVENTION

This invention relates generally to a thin film and methods of formation thereof. More specifically, it relates to very thin films having high uniformity and strength for applications demanding transparency, strength, and uniformity.

BACKGROUND OF THE INVENTION

There are many needs that can be addressed by a very thin membrane material of high uniformity and high tensile strength. One example is the field of transverse electron microscopy (TEM), wherein a TEM grid supporting a taut, extremely thin, and uniform membrane is required to provide specimen support to enable high resolution, high contrast uniformity TEM imaging. The membrane must be free-standing or unsupported in the open regions between grid supports and should also provide adequate electrical conductivity to avoid surface charging and/or damage under electron irradiation.

TEM grids are typically 3 mm copper or silicon discs with arrays of photo-etched holes in their surface so that the TEM electron beam may pass through the hole and be received by the image detector. The objects being imaged are typically supported by only the membrane in the grid holes, so they may be fully imaged, or larger objects may be supported by both the grid and the membrane. Sometimes thin polymer membranes have been used to cover the grid and support the objects to be imaged. In some cases a graphene or lacy carbon film may be used over the grid (either supported or not supported by a polymer film). A carbon film may be supported by a polymer film that is subsequently removed (by dissolution or otherwise). Further, enhanced materials for TEM support membranes have been developed with chemical resistance to particular solvents etc. used during the sample preparation so as not to contaminate the specimen itself via chemical mixing. Carbon films deposited on top of a sacrificial membrane can be very thin (5-50 nanometers) and typically provide adequate chemical inertness together with reasonable uniformity for most TEM imaging. As TEM imaging continues to evolve to higher resolutions and higher magnifications, thinner carbon films (less than about 3 nanometers) and graphene layers that both require a lacey carbon support layer to provide adequate strength for specimen support have been developed in hopes of meeting increasingly stringent demands. These support mechanisms are typically fabricated using layer transfer techniques and have poor yield of usable grid space due to non-uniformity caused by membrane wrinkling, non-uniformity of layer thickness (which causes imaging contrast difficulties), and lack of adhesion to the TEM grid itself which can result in a slack support membrane of low strength and low yield coverage of the grid openings. The use of a lacey carbon support layer further complicates matters as it absorbs the TEM beam as well and so the ultimate usable area of these high-end grids TEM imaging is not always suitable for some modern needs.

To create a useful free-standing support membrane for modern high resolution TEM needs, the following criteria should be met. First, the support membrane must have the mechanical strength to support the specimen and provide a taut surface without wrinkles, holes, or mechanical defects, and should provide a high usable yield of the grid openings. Secondly, the membrane should be adequately inert to the chemicals used during sample preparation to avoid contamination of the specimen itself. Third, the uniformity of the membrane thickness must be tightly controlled so that electron absorption and scatter of the TEM beam is minimized and the background contrast of the beam is homogenous to provide as much usable contrast for specimen analysis as possible. Lastly, the membrane material must be able to withstand the rigors of the TEM process itself. The membrane should be at least somewhat electrically conductive to avoid electrical charging problems when subjected to the TEM beam and must withstand electron bombardment conditions. A very thin carbon film with uniform thickness would suit the purpose, but other membrane materials are also possible.

TEM grids with sacrificial support membranes of various type and compound are known in the prior art. A commonly employed polymer material for a support membrane is known by the trade name FORMVAR® (or VINYLEC®). It may be employed as a support membrane or as a sacrificial support. Other membrane materials also exist and are used for similar purposes. Polymer materials do not always withstand the TEM beam and can burn and deform during TEM beam exposure, contaminating the specimen material, so they are often only employed as sacrificial supports that are removed by dissolution prior to TEM imaging.

Another example of a need that can be satisfied by a very thin, free-standing membrane material of high uniformity and high tensile strength is in the field of pellicles for photomasks and reticles used in projection imaging, etc. In this field, a free-standing membrane supported at a distance from an optical element (photomask, etc.) protects an optical surface from particulate contamination and retains contaminating particles at a position where they are outside of the focal plane for projection imaging. Such membranes require high transparency at the projection wavelengths, high uniformity, and adequate strength to withstand required handling. Historically polymer films such as, for example, polyester film, PTFE, FEP, PFA, etc. have been employed.

Other examples of need will be known to practitioners upon understanding the characteristics and benefits of the invention disclosed below.

It is therefore an object of this invention to provide a very thin, uniform thickness, high-tensile-strength free-standing film for use as a TEM support membrane, a pellicle, or in another requirement demanding such a film.

It is another object of this invention to provide methods for forming a thin, uniform, high-tensile-strength free-standing film by conversion of a surface layer of a polymer using Neutral Beam irradiation, with subsequent removal of any remaining polymer.

A further object of this invention is to provide methods for attaching a thin, uniform, high-tensile-strength free-standing film to a support such as a TEM grid or a pellicle support.

SUMMARY OF THE INVENTION

The present invention is directed toward a very thin film or membrane with high relative strength and a high degree of uniformity of thickness, composition, and properties. Thicknesses of 5 nm and less are readily achieved and this is an advantage of the invention over prior art films. In one embodiment, the film or membrane is carbon-rich, but other compositions are also described. Films or membranes of such strength and uniformity have many applications, but an important example is in forming support membranes on TEM grids for supporting a sample for imaging by TEM imaging. Another important exemplary application is as a pellicle membrane for use with a photolithography mask or reticle. Very thin films or membranes (on the order of a few nanometers thick) may be formed using an accelerated neutral monomer beam derived from an accelerated GCIB. When somewhat thicker films or membranes (on the order of several nanometers to a few hundred nanometers thick) are required, they may be formed using an accelerated GCIB.

The films of the invention may be formed by starting with a film or membrane of a material (typically a polymer) consisting of atoms of materials that are relatively refractory in combination with atoms that are relatively volatile. For example, carbon (C) is a relatively refractory material, while oxygen, hydrogen, and nitrogen (O, H, N) are relatively volatile, being gases under normal conditions of temperature and pressure. Many organic chemicals consisting essentially of C plus atoms from the group O, H, and N form polymers. Likewise, silicone materials comprising silicon (Si) along with oxygen (O), carbon (C), hydrogen, and perhaps other elements are polymers having relatively refractory materials (Si, C) together with relatively volatile materials (O, H) in various combinations.

According to an embodiment of the invention, surfaces of such polymers are treated by irradiation using a dissociated Neutral Beam derived from an accelerated GCIB to convert a thin layer of material at the surface. The neutral particle irradiation modifies the surface layer by intense neutral atom bombardment that preferentially drives the more volatile constituents out of the surface layer, leaving the more refractory ones such as carbon and/or silicon. The resulting film is under tension due to loss of the volatile components and is relatively more chemically inert (not susceptible to dissolution by the solvents normally effective for the original polymer). The penetration of the accelerated dissociated Neutral Beam is dependent on the composition of the polymer being treated and on the acceleration of the GCIB used to generate the dissociated Neutral Beam, as well as the irradiated Neutral Beam dose. For a given polymer material, the thickness of the modified film is controllable by selecting the GCIB parameters that affect the penetration depth of the dissociated Neutral Beam, such as acceleration potential and the irradiated dose. Thicknesses of less than 3 about nm are readily achievable.

Following conversion by Neutral Beam irradiation, the modified surface film can be used as a relatively refractory or inert protective surface barrier layer—such as to reduce susceptibility to chemical reaction or solvation or to reduce uptake by absorption. Alternatively, for polymers having a solvent, the unconverted portion (not beam modified) portion of the polymer may be removed by dissolution using a suitable solvent, which dissolves the polymer, but not the more inert or refractory modified layer. By this technique, a free-standing or unsupported film of the beam-modified polymer can be realized for applications where a very thin membrane is required. In some embodiments of the invention, such free-standing membranes are attached to supports such as TEM grids or pellicle holders, so that the membranes can be employed as supports or shields. In such cases the tension developed in the membrane due to loss of volatiles under irradiation results in a taut membrane free of folds or wrinkles.

In one embodiment, the starting polymer may be poly (vinyl formal), or a copolymer thereof with another poly (vinyl acetal) as are sold under the trade name of FORMVAR® or VINYLEC®, which are soluble in, for examples, chloroform, 1,2-dichloroethane, or dioxane. For convenience herein, poly(vinyl formal) and its copolymers with poly(vinyl acetal) are referred to simply as poly(vinyl formal). A solution of the poly(vinyl formal) in a suitable solvent may be used to form a starting film by solvent evaporation on a smooth surface, or by spin-forming on a conventional spin coating device. The starting film, layer or membrane need not be particularly thin (for example from a few nm to 100 micrometers or more) nor particularly uniform in thickness, and thus is readily obtained.

The starting film layer or membrane is attached to a support such as a commercially available TEM grid or a pellicle support. The support is used to deploy the starting film in a Neutral Beam processing system, for example as shown in FIG. 4 herein, where it is irradiated using a dissociated Neutral Beam derived from an accelerated GCIB to form a very thin converted layer in the surface of the starting film. Following irradiation, the remaining unmodified portion of the starting film is removed by dissolution—the beam-irradiated, modified surface film is substantially carbonized and carbon-rich and therefore no longer soluble, and so remains unaffected. The result is that a very thin, uniform, taut membrane remains, attached to and supported by the support (TEM grid or pellicle holder.) The thickness of the membrane resulting after dissolution of the unmodified starting film is very uniform because it is controlled by the beam penetration and independent of the initial thickness variations in the starting film.

A dissociated Neutral Beam derived from an accelerated GCIB is uniquely suited for the surface modification required for the invention when very thin membranes or films are required (for example, less than 3 nm). Very high fluxes of relatively low energy neutral atoms are generated by the technique. Due to lack of space charge in the beam, such beams can be easily transported over reasonable distances without losses, enabling high doses of atoms in a suitable range of energies (of from about 1 eV to about 100 ev) in short time periods for rapid modification of very shallow layers. Suitably high doses in that energy range are not economically achievable by other beam techniques. Furthermore, processing by irradiation with a dissociated, Neutral Beam derived from an accelerated GCIB gives a much more uniform film with smoother surfaces on both the irradiated side and the dissolution side (due to the smooth, abrupt transition from modified to unmodified material at the interface between the modified layer and the starting material).

When thicker films or membranes are desired (for example greater than 3 nm), GCIB or other more penetrating beams may be utilized.

One embodiment of the present invention provides a method of forming a film comprising the steps of: providing a starting layer of a starting material, the layer having opposed first and second surfaces and an initial thickness, $T_1$, thicker than a desired final film thickness, $T_2$; providing a support layer having an opening; supporting the starting layer on the support layer, suspending the first surface across the opening; irradiating a portion of the second surface over the opening with an energetic particle beam to modify the irradiated surface portion to a depth of thickness $T_2$; and treating the first surface of the irradiated starting layer with a solvent to remove unmodified starting material and to leave a film of thickness $T_2$ over at least a portion of the opening.

The step of supporting the first surface of the starting material may include attaching the first layer to the support layer along the first surface. The attaching step may attach the starting membrane to the membrane support by molecular attraction or by the use of an adhesive or a solvent. The step of irradiating may uniformly irradiate the surface portion. The energetic particle beam may be a gas-cluster ion-beam. The thickness, $T_2$, may be in the range of from 20 nm to 500 nm. The energetic particle beam may be a dissociated neutral beam formed from an accelerated gas-cluster ion-beam. The thickness, $T_2$, may be less than 5 nm. The thickness, $T_2$, may be less than or equal to 3 nm. The starting material may be a polymer. The polymer may be poly(vinyl formal) or polydimethylsiloxane. The solvent may comprise any of the group consisting of chloroform, 1,2-dichloroethane, dioxane, tert-butyl alcohol, and an aliphatic hydrocarbon. The support layer may be a TEM grid or a pellicle support. The energetic beam may comprise atoms of any of the group consisting of argon, xenon, carbon, oxygen, and silicon. The film may be carbon enriched or silicon enriched by the step of irradiating.

Another embodiment of the present invention provides a film made by the above described, wherein the film may be a TEM support film.

Yet another embodiment of the present invention provides a free-standing film made by the above described method, wherein the free-standing film may be a pellicle film.

Still another embodiment of the present invention provides a modified film, comprising: an unmodified starting layer of a starting material, the starting layer having opposed first and second surfaces and an initial thickness, $T_1$; and a modified surface layer of thickness $T_2$, which is less than $T_1$, formed in at least a portion of the second surface, wherein a portion of the modified surface layer is not supported by unmodified starting material removed from the first surface opposite the modified surface layer.

The modified film may further comprise a support layer attached to the first surface of the starting layer, the support layer having an opening aligned under the portion of the second surface. The starting layer may be a film or membrane. The modified film may be a TEM support film or a pellicle film. The starting material may be a polymer, poly(vinyl formal) or polydimethylsiloxane. The modified surface layer may be carbon enriched or silicon enriched. The modified surface layer may be less than or equal to 3 nm thick.

An even further embodiment of the present invention provides a method of forming a film comprising the steps of: providing a starting layer of a starting material, the layer having opposed first and second surfaces and an initial thickness, $T_1$, thicker than a desired final film thickness, $T_2$; irradiating at least a portion of the second surface with an energetic particle beam to modify the irradiated surface to a depth of thickness $T_2$; and treating the first surface of the irradiated starting layer with a solvent to remove unmodified starting material and to leave a film of thickness $T_2$ over at least a portion of the starting layer.

BRIEF DESCRIPTION OF THE DRAWINGS

FIG. 6B includes a prior art membrane for supporting an object for TEM imaging;

DETAILED DESCRIPTION OF THE PREFERRED METHODS AND EXEMPLARY EMBODIMENTS

Figure 1:
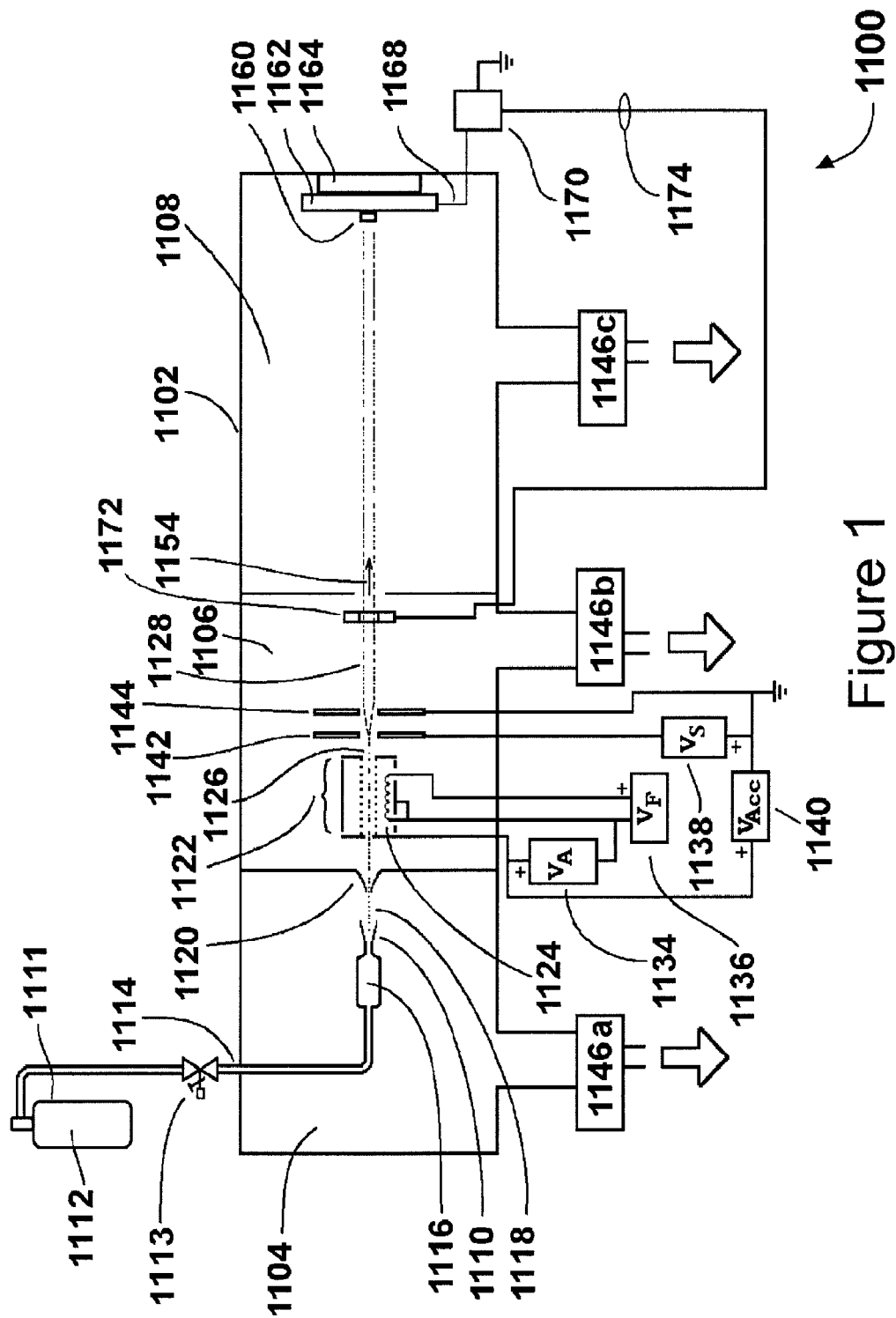
FIG. 1 is a schematic illustrating elements of a GCIB processing apparatus 1100 for processing a workpiece using a GCIB.

Methods and apparatus for forming Neutral Beams by first forming an accelerated charged GCIB and then neutralizing or arranging for neutralization of at least a fraction of the beam and separating the charged and uncharged fractions are disclosed herein. The Neutral Beams may consist of neutral gas clusters, neutral monomers, or a combination of both, but are preferably fully dissociated to neutral monomers.

As compared to GCIB processes, the use of an accelerated Neutral Beam provides a physical surface modification method that results in minimized introduction of charging effects at the surface (especially important when the material is not an electrically conducting material) or when surface charging can harm the material, and thus avoids creating sub-surface damage due to charging effects in insulating materials like silica and other similar materials. In some cases it also reduces average surface roughness below conventional secondary polishing levels, while retaining a high degree of planarity.

Beams of energetic conventional ions, accelerated electrically charged atoms or molecules, are widely utilized to form semiconductor device junctions, to modify surfaces by sputtering and etching, and to modify the properties of thin films. Unlike conventional ions, gas-cluster ions are formed from clusters of large numbers (having a typical distribution of several hundred to several thousand with a mean value of a few thousand) of weakly bound atoms or molecules of materials that are gaseous under conditions of standard temperature and pressure (commonly oxygen, nitrogen, or an inert gas such as argon, for example, but any condensable gas can be used to generate gas-cluster ions) with each cluster sharing one or more electrical charges, and which are accelerated together through large electric potential differences (on the order of from about 3 kV to about 70 kV or more) to have high total energies. After gas-cluster ions have been formed and accelerated, their charge states may be altered or become altered (even neutralized) by collisions with other cluster ions, other neutral clusters, or residual background gas particles, and thus they may fragment or may be induced to fragment into smaller cluster ions or into monomer ions and/or into neutralized smaller clusters and neutralized monomers, but the resulting cluster ions, neutral clusters, and monomer ions and neutral monomers tend to retain the relatively high velocities and energies that result from having been accelerated through large electric potential differences, with the accelerated gas-cluster ion energy being distributed over the fragments.

As used herein, the terms "GCIB", "gas-cluster ion-beam" and "gas-cluster ion" are intended to encompass not only ionized beams and ions, but also accelerated beams and ions that have had a portion of their charge states modified (including neutralized) following their acceleration. The terms "GCIB" and "gas-cluster ion-beam" are intended to encompass all beams that comprise accelerated gas-cluster ions even though they may also comprise non-clustered particles. As used herein, the term "Neutral Beam" is intended to mean a beam of neutral gas clusters and/or neutral monomers derived from an accelerated gas-cluster ion-beam and wherein the acceleration results from acceleration of a gas-cluster ion-beam. As used herein, the term "monomer" refers equally to either a single atom or a single molecule. The terms "atom," "molecule," and "monomer" may be used interchangeably and all refer to the appropriate monomer that is characteristic of the gas under discussion (either a component of a cluster, a component of a cluster ion, or an atom or molecule). For example, a monatomic gas like argon may be referred to in terms of atoms, molecules, or monomers and each of those terms means a single atom. Likewise, in the case of a diatomic gas like nitrogen, it may be referred to in terms of atoms, molecules, or monomers, each term meaning a diatomic molecule. Furthermore a molecular gas like $CH_4$, may be referred to in terms of atoms, molecules, or monomers, each term meaning a five atom molecule, and so forth. These conventions are used to simplify generic discussions of gases and gas clusters or gas-cluster ions independent of whether they are monatomic, diatomic, or molecular in their gaseous form.

Because the energies of individual atoms within a large gas-cluster ion are very small, typically a few eV to some tens of eV, the atoms penetrate through, at most, only a few atomic layers of a target surface during impact. This shallow penetration (typically a few nanometers to about ten nanometers, depending on the beam acceleration) of the impacting atoms means all of the energy carried by the entire cluster ion is consequently dissipated in an extremely small volume in a very shallow surface layer during a time period of less than a microsecond. This differs from conventional ion beams where the penetration into the material is sometimes several hundred nanometers, producing changes and material modification deep below the surface of the material. Because of the high total energy of the gas-cluster ion and extremely small interaction volume, the deposited energy density at the impact site is far greater than in the case of bombardment by conventional ions. Accordingly, GCIB modification of a surface tends to produce a shallower region of atomic mixing and has thus been favored as an etching beam for depth profiling in analytical instruments. Neutral Beam processing of a surface can produce even shallower modification of a surface with less surface electrical charging.

When accelerated gas-cluster ions are fully dissociated and neutralized, the resulting neutral monomers will have energies approximately equal to the total energy of the original accelerated gas-cluster ion, divided by the number, $N_1$, of monomers that comprised the original gas-cluster ion at the time it was accelerated. Such dissociated neutral monomers will have energies on the order of from about 1 eV to tens or even as much as a few thousands of eV, depending on the original accelerated energy of the gas-cluster ion and the size of the gas-cluster ion at the time of acceleration.

Gas-cluster ion-beams are generated and transported for purposes of irradiating a workpiece according to known techniques. Various types of holders are known in the art for holding the object in the path of the GCIB for irradiation and for manipulating the object to permit irradiation of a multiplicity of portions of the object. Neutral Beams may be generated and transported for purposes of irradiating a workpiece according to techniques taught herein.

The present invention may employ a high beam-purity method and system for deriving from an accelerated gas-cluster ion-beam an accelerated neutral gas cluster and/or preferably monomer beam that can be employed for a variety of types of surface and shallow subsurface materials processing and which is capable, for many applications, of superior performance compared to conventional GCIB processing. A Neutral Beam apparatus can provide well-focused, accelerated, intense neutral monomer beams with particles having energies in the range of from about 1 eV to as much as a few thousand eV. This is an energy range in which it has heretofore been impractical with simple, relatively inexpensive apparatus to form intense neutral beams.

These accelerated Neutral Beams are generated by first forming a conventional accelerated GCIB, then partly or essentially fully dissociating it by methods and operating conditions that do not introduce impurities into the beam, then separating the remaining charged portions of the beam from the neutral portion, and subsequently using the resulting accelerated Neutral Beam for workpiece processing. Depending on the degree of dissociation of the gas-cluster ions, the Neutral Beam produced may be a mixture of neutral gas monomers and gas clusters or may essentially consist entirely or almost entirely of neutral gas monomers. It is preferred that the accelerated Neutral Beam is a fully dissociated neutral monomer beam.

An advantage of the Neutral Beams that may be produced by the methods and apparatus of this invention, is that they may be used to process electrically insulating materials without producing damage to the material due to charging of the surfaces of such materials by beam transported charges as commonly occurs for all ionized beams including GCIB. For example, in some applications, ions often contribute to damaging or destructive charging of thin dielectric films such as oxides, nitrides, etc. The use of Neutral Beams can enable successful beam processing of polymer, dielectric, and/or other electrically insulating or high electrical resistivity materials, coatings, and films in applications where ion beams may produce undesired side effects due to surface or other charging effects. Examples include (without limitation) processing of corrosion inhibiting coatings, and irradiation cross-linking and/or polymerization of organic films. Further examples include Neutral Beam processing of glass, polymer, and ceramic materials as well as thin film dielectric coatings such as oxides, nitrides, glasses, etc.

Another advantage of accelerated neutral monomer beams derived from an accelerated GCIB, when used in surface modification applications, is that they form a much shallower modified layer in the processed surface when compared even with GCIBs used in the same way.

Since the parent GCIB, from which accelerated Neutral Beams may be formed by the methods and apparatus of the invention, comprises ions it is readily accelerated to desired energy and is readily focused using conventional ion beam techniques. Upon subsequent dissociation and separation of the charged ions from the neutral particles, the neutral beam particles tend to retain their focused trajectories and may be transported for extensive distances with good effect.

When neutral gas clusters in a jet are ionized by electron bombardment, they become heated and/or excited. This may result in subsequent evaporation of monomers from the ionized gas cluster, after acceleration, as it travels down the beamline. Additionally, collisions of gas-cluster ions with background gas molecules in the ionizer, accelerator and beamline regions also heat and excite the gas-cluster ions and may result in additional subsequent evolution of monomers from the gas-cluster ions following acceleration. When these mechanisms for evolution of monomers are induced by electron bombardment and/or collision with background gas molecules (and/or other gas clusters) of the same gas from which the GCIB was formed, no contamination is contributed to the beam by the dissociation processes that results in evolving the monomers.

There are other mechanisms that can be employed for dissociating (or inducing evolution of monomers from) gas-cluster ions in a GCIB without introducing contamination into the beam. Some of these mechanisms may also be employed to dissociate neutral gas-clusters in a neutral gas-cluster beam. One mechanism is laser irradiation of the gas-cluster ion-beam using infra-red or other laser energy. Laser-induced heating of the gas-cluster ions in the laser irradiated GCIB results in excitement and/or heating of the gas-cluster ions and causes subsequent evolution of monomers from the beam. Another mechanism is passing the beam through a thermally heated tube so that radiant thermal energy photons impact the gas-cluster ions in the beam. The induced heating of the gas-cluster ions by the radiant thermal energy in the tube results in excitement and/or heating of the gas-cluster ions and causes subsequent evolution of monomers from the beam. In another mechanism, crossing the gas-cluster ion-beam by a gas jet of the same gas or mixture as the source gas used in formation of the GCIB (or other non-contaminating gas) results in collisions of monomers of the gas in the gas jet with the gas clusters in the ion beam producing excitement and/or heating of the gas-cluster ions in the beam and subsequent evolution of monomers from the excited gas-cluster ions. By depending entirely on electron bombardment during initial ionization and/or collisions (with other cluster ions, or with background gas molecules of the same gas(es) as those used to form the GCIB) within the beam and/or laser or thermal radiation and/or crossed jet collisions of non-contaminating gas to produce the GCIB dissociation and/or fragmentation, contamination of the beam by collision with other materials is avoided.

Through the use of such non-contaminating methods of dissociation described above, the GCIB is dissociated or at least partially dissociated without introducing atoms to the dissociation products or residual clusters that are not part of the original source gas atoms. By using a source gas for initial cluster formation that does not contain atoms which would be contaminants for the workpiece to be processed using the residual clusters or dissociation products, contamination of the workpiece is avoided. When argon or other noble gases are employed, the source gas materials are volatile and not chemically reactive, and upon subsequent irradiation of the workpiece using Neutral Beams these volatile non-reactive atoms are fully released from the workpiece. Thus for workpieces that are optical materials including glasses, quartz, sapphire, diamond, and other hard, transparent materials, argon and other noble gases can serve as source gas materials without contributing contamination due to Neutral Beam irradiation. In other cases, other source gases may be employed, provided the source gas atomic constituents do not include atoms that would result in contamination of the workpiece. For example, glass and silica workpieces, and various other optical materials are oxygen-containing, and oxygen atoms may not serve as contaminants. In such cases oxygen-containing source gases may be employed without contamination, and so forth for other gases and workpiece materials.

As a neutral gas-cluster jet from a nozzle travels through an ionizing region where electrons are directed to ionize the clusters, a cluster may remain un-ionized or may acquire a charge state, q, of one or more charges (by ejection of electrons from the cluster by an incident electron). The ionizer operating conditions influence the likelihood that a gas cluster will take on a particular charge state, with more intense ionizer conditions resulting in greater probability that a higher charge state will be achieved. More intense ionizer conditions resulting in higher ionization efficiency may result from higher electron flux and/or higher (within limits) electron energy. Once the gas cluster has been ionized, it is typically extracted from the ionizer, focused into a beam, and accelerated by falling through an electric field. The amount of acceleration of the gas-cluster ion is readily controlled by controlling the magnitude of the accelerating electric field. Typical commercial GCIB processing tools generally provide for the gas-cluster ions to be accelerated by an electric field having an adjustable accelerating potential, $V_{Acc}$, typically of, for example, from about 1 kV to 70 kV (but not limited to that range—$V_{Acc}$ up to 200 kV or even more may be feasible). Thus a singly charged gas-cluster ion achieves an energy in the range of from 1 to 70 keV (or more if larger $V_{Acc}$ is used) and a multiply charged (for example, without limitation, charge state, q=3 electronic charges) gas-cluster ion achieves an energy in the range of from 3 to 210 keV (or more for higher $V_{Acc}$). For other gas-cluster ion charge states and acceleration potentials, the accelerated energy per cluster is $qV_{Acc}$ eV. From a given ionizer with a given ionization efficiency, gas-cluster ions will have a distribution of charge states from zero (not ionized) to a higher number such as, for example, 6 (or with high ionizer efficiency, even more), and the most probable and mean values of the charge state distribution also increase with increased ionizer efficiency (higher electron flux and/or energy). Higher ionizer efficiency also results in increased numbers of gas-cluster ions being formed in the ionizer. In many cases, GCIB processing throughput increases when operating the ionizer at high efficiency results in increased GCIB current. A downside of such operation is that multiple charge states that may occur on intermediate size gas-cluster ions can increase crater and/or rough interface formation by those ions, and often such effects may operate counterproductively to the intent of the processing. Thus for many GCIB surface processing recipes, selection of the ionizer operating parameters tends to involve more considerations than just maximizing beam current. In some processes, use of a "pressure cell" (see U.S. Pat. No. 7,060,989, to Swenson et al.) may be employed to permit operating an ionizer at high ionization efficiency while still obtaining acceptable beam processing performance by moderating the beam energy by gas collisions in an elevated pressure "pressure cell."

With the present invention there is no downside to operating the ionizer at high efficiency—in fact such operation may be preferred. When the ionizer is operated at high efficiency, there may be a wide range of charge states in the gas-cluster ions produced by the ionizer. This results in a wide range of velocities in the gas-cluster ions in the extraction region between the ionizer and the accelerating electrode, and also in the downstream beam. This may result in an enhanced frequency of collisions between and among gas-cluster ions in the beam that generally results in a higher degree of fragmentation of the largest gas-cluster ions. Such fragmentation may result in a redistribution of the cluster sizes in the beam, skewing it toward the smaller cluster sizes. These cluster fragments retain energy in proportion to their new size (N) and so become less energetic while essentially retaining the accelerated velocity of the initial unfragmented gas-cluster ion. The change of energy with retention of velocity following collisions has been experimentally verified (as for example reported in Toyoda, N. et al., "Cluster size dependence on energy and velocity distributions of gas-cluster ions after collisions with residual gas," *Nucl. Instr. & Meth. in Phys. Research B* 257 (2007), pp 662-665). Fragmentation may also result in redistribution of charges in the cluster fragments. Some uncharged fragments likely result and multi-charged gas-cluster ions may fragment into several charged gas-cluster ions and perhaps some uncharged fragments. It is understood by the inventors that design of the focusing fields in the ionizer and the extraction region may enhance the focusing of the smaller gas-cluster ions and monomer ions to increase the likelihood of collision with larger gas-cluster ions in the beam extraction region and in the downstream beam, thus contributing to the dissociation and/or fragmenting of the gas-cluster ions.

In generating a Neutral Beam, background gas pressure in the ionizer, acceleration region, and beamline may optionally be arranged to have a higher pressure than is normally utilized for good GCIB transmission. This can result in additional evolution of monomers from gas-cluster ions (beyond that resulting from the heating and/or excitement resulting from the initial gas cluster ionization event). Pressure may be arranged so that gas-cluster ions have a short enough mean-free-path and a long enough flight path between ionizer and workpiece that they must undergo multiple collisions with background gas molecules.

For a homogeneous gas-cluster ion containing N monomers and having a charge state of q and which has been accelerated through an electric field potential drop of $V_{Acc}$ volts, the cluster will have energy of approximately $qV_{Acc}/N_1$ eV per monomer, where $N_1$ is the number of monomers in the cluster ion at the time of acceleration. Except for the smallest gas-cluster ions, a collision of such an ion with a background gas monomer of the same gas as the cluster source gas will result in additional deposition of approximately $qV_{Acc}/N_1$ eV into the gas-cluster ion. This energy is relatively small compared to the overall gas-cluster ion energy ($qV_{Acc}$) and generally results in excitation or heating of the cluster and in subsequent evolution of monomers from the cluster. It is believed that such collisions of larger clusters with background gas seldom fragment the cluster but rather heats and/or excites it to result in evolution of monomers by evaporation or similar mechanisms. Regardless of the source of the excitation that results in the evolution of a monomer or monomers from a gas-cluster ion, the evolved monomer(s) have approximately the same energy per particle, $qV_{Acc}/N_1$ eV, and retain approximately the same velocity and trajectory as the gas-cluster ion from which they have evolved. When such monomer evolutions occur from a gas-cluster ion, whether they result from excitation or heating due to the original ionization event, a collision, or radiant heating, the charge has a high probability of remaining with the larger residual gas-cluster ion. Thus after a sequence of monomer evolutions, a large gas-cluster ion may be reduced to a cloud of co-traveling monomers with perhaps a smaller residual gas-cluster ion (or possibly several if fragmentation has also occurred). The co-traveling monomers following the original beam trajectory all have approximately the same velocity as that of the original gas-cluster ion and each has energy of approximately $qV_{Acc}/N_1$ eV. For small gas-cluster ions, the energy of collision with a background gas monomer is likely to completely and violently dissociate the small gas cluster and it is uncertain whether in such cases the resulting monomers continue to travel with the beam or are ejected from the beam.

Prior to the GCIB reaching the workpiece, the remaining charged particles (gas-cluster ions, particularly small and intermediate size gas-cluster ions and some charged monomers, but also including any remaining large gas-cluster ions) in the beam are separated from the neutral portion of the beam, leaving only a Neutral Beam for processing the workpiece.

In typical operation, the fraction of power in the neutral beam components relative to that in the full (charged plus neutral) beam delivered at the processing target is in the range of from about 5% to 95%, so by the separation methods and apparatus of the present invention it is possible to deliver that portion of the kinetic energy of the full accelerated charged beam to the target as a Neutral Beam.

The dissociation of the gas-cluster ions and thus the production of high neutral monomer beam energy is facilitated by 1) Operating at higher acceleration voltages. This increases $qV_{Acc}/N$ for any given cluster size. 2) Operating at high ionizer efficiency. This increases $qV_{Acc}/N$ for any given cluster size by increasing q and increases cluster-ion on cluster-ion collisions in the extraction region due to the differences in charge states between clusters; 3) Operating at a high ionizer, acceleration region, or beamline pressure or operating with a gas jet crossing the beam, or with a longer beam path, all of which increase the probability of background gas collisions for a gas-cluster ion of any given size; 4) Operating with laser irradiation or thermal radiant heating of the beam, which directly promote evolution of monomers from the gas-cluster ions; and 5) Operating at higher nozzle gas flow, which increases transport of gas, clustered and perhaps unclustered into the GCIB trajectory, which increases collisions resulting in greater evolution of monomers.

Measurement of the Neutral Beam cannot be made by electrical beam current or charge measurement as is convenient for gas-cluster ion-beams. A Neutral Beam power sensor may be used to facilitate dosimetry when irradiating a workpiece with a Neutral Beam. The Neutral Beam sensor may be a thermal sensor that intercepts the beam (or optionally a known sample of the beam). The rate of rise of temperature of the sensor is related to the energy flux resulting from energetic beam irradiation of the sensor. Such thermal measurements must be made over a limited range of temperatures of the sensor to avoid errors due to thermal re-radiation of the energy incident on the sensor. For a GCIB process, the beam power (watts) is equal to the beam current (amps) times $V_{Acc}$, the beam acceleration voltage. When a GCIB irradiates a workpiece for a period of time (seconds), the energy (joules) received by the workpiece is the product of the beam power and the irradiation time. The processing effect of such a beam when it processes an extended area is distributed over the area (for example, cm²). For ion beams, it has been conveniently conventional to specify a processing dose in terms of irradiated ions/cm$^2$, where the ions are either known or assumed to have at the time of acceleration an average charge state, q, and to have been accelerated through a potential difference of, $V_{Acc}$ volts, so that each ion carries an energy of q $V_{Acc}$ eV (an eV is approximately 1.6×10$^{-19}$ joule). Thus an ion beam dose for an average charge state, q, accelerated by $V_{Acc}$ and specified in ions/cm$^2$ corresponds to a readily calculated energy dose expressible in joules/cm$^2$. For an accelerated Neutral Beam derived from an accelerated GCIB as utilized in the present invention, the value of q at the time of acceleration and the value of $V_{Acc}$ is the same for both of the (later-formed and separated) charged and uncharged fractions of the beam. The power in the two (neutral and charged) fractions of the GCIB divides proportional to the mass in each beam fraction. Thus for the accelerated Neutral Beam as employed in the invention, when equal areas are irradiated for equal times, the energy dose (joules/cm$^2$) deposited by the Neutral Beam is necessarily less than the energy dose deposited by the full GCIB. By using a thermal sensor to measure the power in the full GCIB $P_G$ and that in the Neutral Beam $P_N$ (which is commonly found to be about 5% to 95% that of the full GCIB) it is possible to calculate a compensation factor for use in the Neutral Beam processing dosimetry. When $P_N$ is $aP_G$, then the compensation factor is, k=1/a. Thus if a workpiece is processed using a Neutral Beam derived from a GCIB, for a time duration is made to be k times greater than the processing duration for the full GCIB (including charged and neutral beam portions) required to achieve a dose of D ions/cm$^2$, then the energy doses deposited in the workpiece by both the Neutral Beam and the full GCIB are the same (though the results may be different due to qualitative differences in the processing effects due to differences of particle sizes in the two beams.) As used herein, a Neutral Beam process dose compensated in this way is sometimes described as having an energy/cm$^2$ equivalence of a dose of D ions/cm$^2$.

Other methods for Neutral Beam dosimetry may also be employed. Examples of such alternative methods are disclosed in commonly held U.S. patent application Ser. No. 13/660,295 filed 25 Oct. 2012, entitled "DIAGNOSTIC METHOD AND APPARATUS FOR CHARACTERIZATION OF A NEUTRAL BEAM AND FOR PROCESS CONTROL THEREWITH", the contents of which are hereby incorporated by reference herein.

In the following description, for simplification, item numbers from earlier-described figures may appear in subsequently-described figures without discussion. Likewise, items discussed in relation to earlier figures may appear in subsequent figures without item numbers or additional description. In such cases items with like numbers are like items and have the previously-described features and functions, and illustration of items without item numbers shown in the present figure refer to like items having the same functions as the like items illustrated in earlier-discussed numbered figures.

Reference is now made to FIG. 1, which shows a schematic configuration for a GCIB processing apparatus 1100. A low-pressure vessel 1102 has three fluidly connected chambers: a nozzle chamber 1104, an ionization/acceleration chamber 1106, and a processing chamber 1108. The three chambers are evacuated by vacuum pumps 1146a, 1146b, and 1146c, respectively. A pressurized condensable source gas 1112 (for example argon) stored in a gas storage cylinder 1111 flows through a gas metering valve 1113 and a feed tube 1114 into a stagnation chamber 1116. Pressure (typically a few atmospheres) in the stagnation chamber 1116 results in ejection of gas into the substantially lower pressure vacuum through a nozzle 1110, resulting in formation of a supersonic gas jet 1118. Cooling, resulting from the expansion in the jet, causes a portion of the gas jet 1118 to condense into clusters, each consisting of from several to several thousand weakly bound atoms or molecules. A gas skimmer aperture 1120 is employed to control flow of gas into the downstream chambers by partially separating gas molecules that have not condensed into a cluster jet from the cluster jet. Excessive pressure in the downstream chambers can be detrimental by interfering with the transport of gas-cluster ions and by interfering with management of the high voltages that may be employed for beam formation and transport. Suitable condensable source gases 1112 include, but are not limited to argon and other condensable noble gases, nitrogen, carbon dioxide, oxygen, and many other gases and/or gas mixtures. After formation of the gas clusters in the supersonic gas jet 1118, at least a portion of the gas clusters are ionized in an ionizer 1122 that is typically an electron impact ionizer that produces electrons by thermal emission from one or more incandescent filaments 1124 (or from other suitable electron sources) and accelerates and directs the electrons, enabling them to collide with gas clusters in the gas jet 1118. Electron impacts with gas clusters eject electrons from some portion of the gas clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 1142, and grounded electrode 1144 extract the cluster ions from the ionizer exit aperture 1126, accelerate them to a desired energy (typically with acceleration potentials of from several hundred V to several tens of kV), and focuses them to form a GCIB 1128. The region that the GCIB 1128 traverses between the ionizer exit aperture 126 and the suppressor electrode 1142 is referred to as the extraction region. The axis (determined at the nozzle 1110), of the supersonic gas jet 1118 containing gas clusters is substantially the same as the axis 1154 of the GCIB 1128. Filament power supply 1136 provides filament voltage $V_f$ to heat the ionizer filament 1124. Anode power supply 1134 provides anode voltage $V_A$ to accelerate thermoelectrons emitted from filament 1124 to cause the thermoelectrons to irradiate the cluster-containing gas jet 1118 to produce cluster ions. A suppression power supply 1138 supplies suppression voltage $V_S$ (on the order of several hundred to a few thousand volts) to bias suppressor electrode 1142. Accelerator power supply 1140 supplies acceleration voltage $V_{Acc}$ to bias the ionizer 1122 with respect to suppressor electrode 1142 and grounded electrode 1144 so as to result in a total GCIB acceleration potential equal to $V_{Acc}$. Suppressor electrode 1142 serves to extract ions from the ionizer exit aperture 1126 of ionizer 1122 and to prevent undesired electrons from entering the ionizer 1122 from downstream, and to form a focused GCIB 1128.

A workpiece 1160, which may (for example) be a medical device, a semiconductor material, an optical element, or other workpiece to be processed by GCIB processing, is held on a workpiece holder 1162, which disposes the workpiece in the path of the GCIB 1128. The workpiece holder is attached to but electrically insulated from the processing chamber 1108 by an electrical insulator 1164. Thus, GCIB 1128 striking the workpiece 1160 and the workpiece holder 1162 flows through an electrical lead 1168 to a dose processor 1170. A beam gate 1172 controls transmission of the GCIB 1128 along axis 1154 to the workpiece 1160. The beam gate 1172 typically has an open state and a closed state that is controlled by a linkage 1174 that may be (for example) electrical, mechanical, or electromechanical. Dose processor 1170 controls the open/closed state of the beam gate 1172 to manage the GCIB dose received by the workpiece 1160 and the workpiece holder 1162. In operation, the dose processor 1170 opens the beam gate 1172 to initiate GCIB irradiation of the workpiece 1160. Dose processor 1170 typically integrates GCIB electrical current arriving at the workpiece 1160 and workpiece holder 1162 to calculate an accumulated GCIB irradiation dose. At a predetermined dose, the dose processor 1170 closes the beam gate 1172, terminating processing when the predetermined dose has been achieved.

Figure 2:
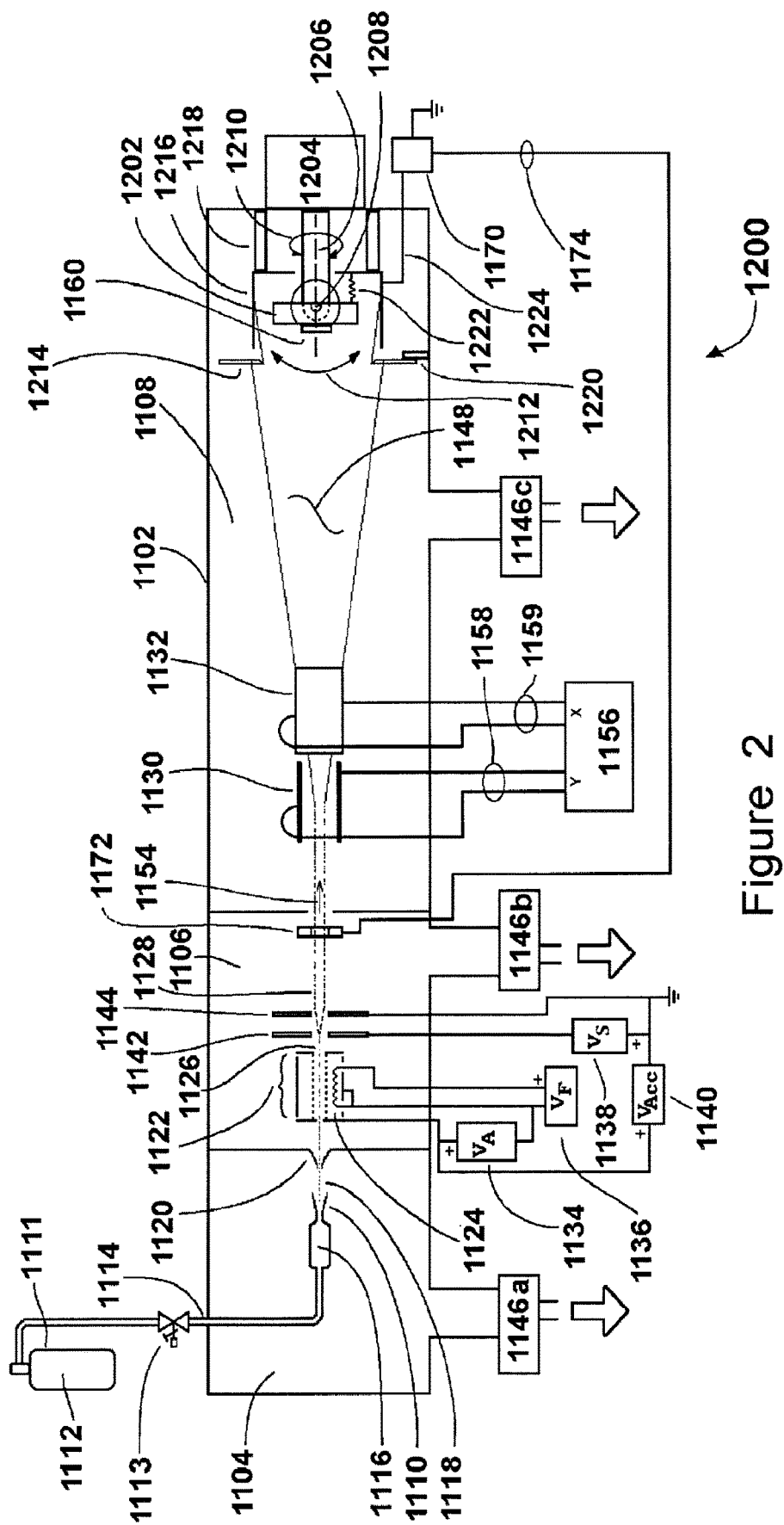
FIG. 2 is a schematic illustrating elements of another GCIB processing apparatus 1200 for workpiece processing using a GCIB, wherein scanning of the ion beam and manipulation of the workpiece is employed.

FIG. 2 shows a schematic illustrating elements of another GCIB processing apparatus 1200 for workpiece processing using a GCIB, wherein scanning of the ion beam and manipulation of the workpiece is employed. A workpiece 1160 to be processed by the GCIB processing apparatus 1200 is held on a workpiece holder 1202, disposed in the path of the GCIB 1128. In order to accomplish uniform processing of the workpiece 1160, the workpiece holder 1202 is designed to manipulate workpiece 1160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 1202 can be fully articulated for orienting all non-planar surfaces to be processed in suitable alignment with the GCIB 1128 to provide processing optimization and uniformity. More specifically, when the workpiece 1160 being processed is non-planar, the workpiece holder 1202 may be rotated in a rotary motion 1210 and articulated in articulation motion 1212 by an articulation/rotation mechanism 1204. The articulation/rotation mechanism 1204 may permit 360 degrees of device rotation about longitudinal axis 1206 (which is coaxial with the axis 1154 of the GCIB 1128) and sufficient articulation about an axis 1208 perpendicular to axis 1206 to maintain the workpiece surface to within a desired range of beam incidence.

Under certain conditions, depending upon the size of the workpiece 1160, a scanning system may be desirable to produce uniform irradiation of a large workpiece. Although often not necessary for GCIB processing, two pairs of orthogonally oriented electrostatic scan plates 1130 and 1132 may be utilized to produce a raster or other scanning pattern over an extended processing area. When such beam scanning is performed, a scan generator 1156 provides X-axis scanning signal voltages to the pair of scan plates 1132 through lead pair 1159 and Y-axis scanning signal voltages to the pair of scan plates 1130 through lead pair 1158. The scanning signal voltages are commonly triangular waves of different frequencies that cause the GCIB 1128 to be converted into a scanned GCIB 1148, which scans the entire surface of the workpiece 1160. A scanned beam-defining aperture 1214 defines a scanned area. The scanned beam-defining aperture 1214 is electrically conductive and is electrically connected to the low-pressure vessel 1102 wall and supported by support member 1220. The workpiece holder 1202 is electrically connected via a flexible electrical lead 1222 to a faraday cup 1216 that surrounds the workpiece 1160 and the workpiece holder 1202 and collects all the current passing through the defining aperture 1214. The workpiece holder 1202 is electrically isolated from the articulation/rotation mechanism 1204 and the faraday cup 1216 is electrically isolated from and mounted to the low-pressure vessel 1102 by insulators 1218. Accordingly, all current from the scanned GCIB 1148, which passes through the scanned beam-defining aperture 1214 is collected in the faraday cup 1216 and flows through electrical lead 1224 to the dose processor 1170. In operation, the dose processor 1170 opens the beam gate 1172 to initiate GCIB irradiation of the workpiece 1160. The dose processor 1170 typically integrates GCIB electrical current arriving at the workpiece 1160 and workpiece holder 1202 and faraday cup 1216 to calculate an accumulated GCIB irradiation dose per unit area. At a predetermined dose, the dose processor 1170 closes the beam gate 1172, terminating processing when the predetermined dose has been achieved. During the accumulation of the predetermined dose, the workpiece 1160 may be manipulated by the articulation/rotation mechanism 1204 to ensure processing of all desired surfaces.

Figure 3:
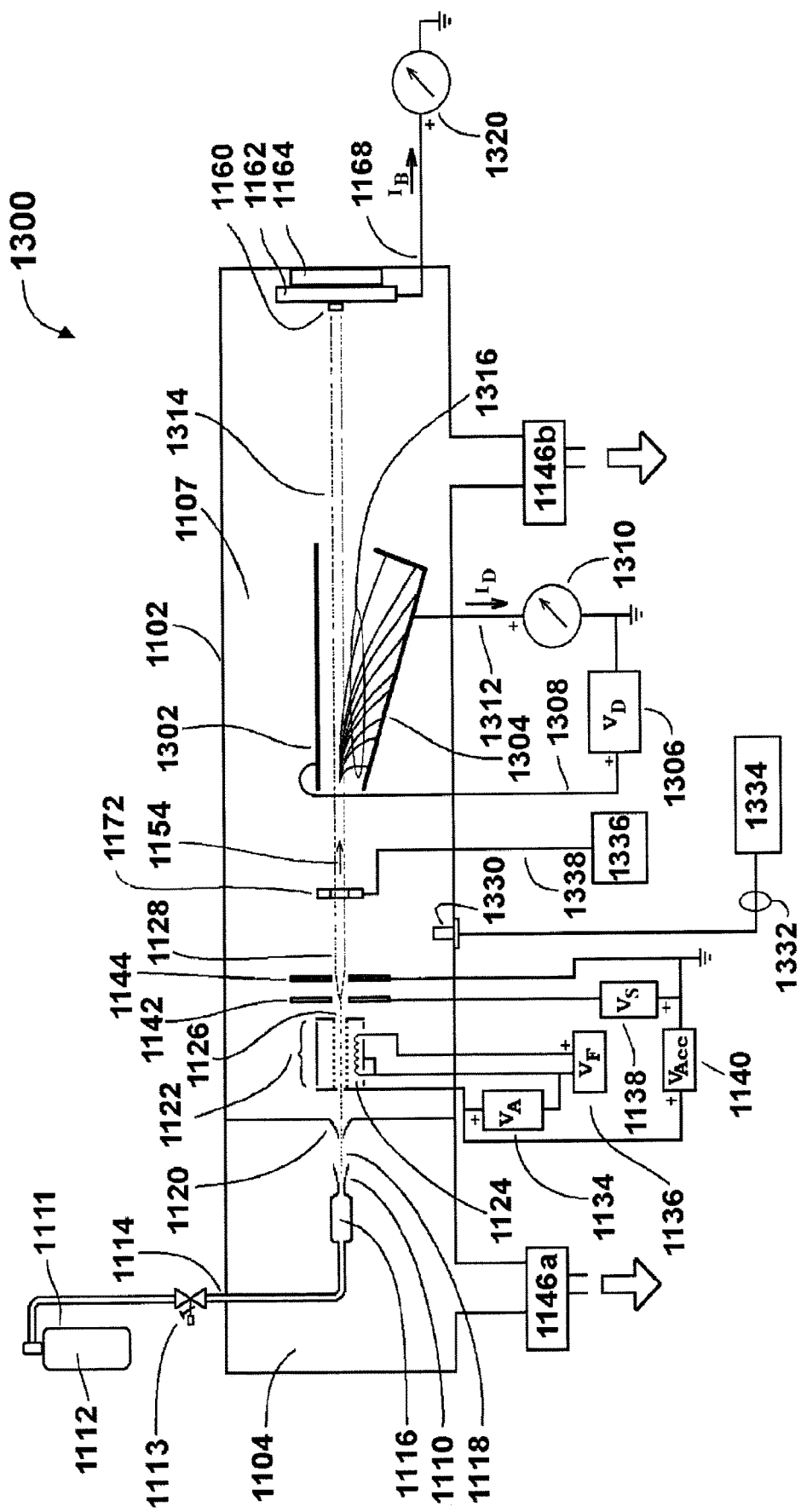
FIG. 3 is a schematic of a Neutral Beam processing apparatus 1300, which uses electrostatic deflection plates to separate the charged and uncharged beams.

FIG. 3 is a schematic of a Neutral Beam processing apparatus 1300 of an exemplary type that may be employed for Neutral Beam processing according to embodiments of the invention. It uses electrostatic deflection plates to separate the charged and uncharged portions of a GCIB. A beamline chamber 1107 encloses the ionizer and accelerator regions and the workpiece processing regions. The beamline chamber 1107 has high conductance and so the pressure is substantially uniform throughout. A vacuum pump 1146*b* evacuates the beamline chamber 1107. Gas flows into the beamline chamber 1107 in the form of clustered and unclustered gas transported by the gas jet 1118 and in the form of additional unclustered gas that leaks through the gas skimmer aperture 1120. A pressure sensor 1330 transmits pressure data from the beamline chamber 1107 through an electrical cable 1332 to a pressure sensor controller 1334, which measures and displays pressure in the beamline chamber 1107. The pressure in the beamline chamber 1107 depends on the balance of gas flow into the beamline chamber 1107 and the pumping speed of the vacuum pump 1146*b*. By selection of the diameter of the gas skimmer aperture 1120, the flow of source gas 1112 through the nozzle 1110, and the pumping speed of the vacuum pump 1146*b*, the pressure in the beamline chamber 1107 equilibrates at a pressure, PB, determined by design and by nozzle flow. The beam flight path from grounded electrode 1144 to workpiece holder 1162, is for example, 100 cm. By design and adjustment PB may be approximately $6\times10^{-5}$ torr ($8\times10^{-3}$ pascal). Thus the product of pressure and beam path length is approximately $6\times10^{-3}$ torr-cm (0.8 pascal-cm) and the gas target thickness for the beam is approximately $1.94\times10^{14}$ gas molecules per cm$^2$, which is observed to be effective for dissociating the gas-cluster ions in the GCIB 1128. $V_{Acc}$ may be for example 30 kV and the GCIB 1128 is accelerated by that potential. A pair of deflection plates (1302 and 1304) is disposed about the axis 1154 of the GCIB 1128. A deflector power supply 1306 provides a positive deflection voltage $V_D$ to deflection plate 1302 via electrical lead 1308. Deflection plate 1304 is connected to electrical ground by electrical lead 1312 and through current sensor/display 1310. Deflector power supply 1306 is manually controllable. $V_D$ may be adjusted from zero to a voltage sufficient to completely deflect the ionized portion 1316 of the GCIB 1128 onto the deflection plate 1304 (for example a few thousand volts). When the ionized portion 1316 of the GCIB 1128 is deflected onto the deflection plate 1304, the resulting current, $I_D$ flows through electrical lead 1312 and current sensor/display 1310 for indication. When $V_D$ is zero, the GCIB 1128 is undeflected and travels to the workpiece 1160 and the workpiece holder 1162. The GCIB beam current $I_B$ is collected on the workpiece 1160 and the workpiece holder 1162 and flows through electrical lead 1168 and current sensor/display 1320 to electrical ground. $I_B$ is indicated on the current sensor/display 1320. A beam gate 1172 is controlled through a linkage 1338 by beam gate controller 1336. Beam gate controller 1336 may be manual or may be electrically or mechanically timed by a preset value to open the beam gate 1172 for a predetermined interval. In use, $V_D$ is set to zero and the beam current, $I_B$, striking the workpiece holder is measured. Based on previous experience for a given GCIB process recipe, an initial irradiation time for a given process is determined based on the measured current, $I_B$. $V_D$ is increased until all measured beam current is transferred from $I_B$ to $I_D$ and $I_D$ no longer increases with increasing $V_D$. At this point a Neutral Beam 1314 comprising energetic dissociated components of the initial GCIB 1128 irradiates the workpiece holder 1162. The beam gate 1172 is then closed and the workpiece 1160 placed onto the workpiece holder 1162 by conventional workpiece loading means (not shown). The beam gate 1172 is opened for the predetermined initial radiation time. After the irradiation interval, the workpiece may be examined and the processing time adjusted as necessary to calibrate the duration of Neutral Beam processing based on the measured GCIB beam current 1B. Following such a calibration process, additional workpieces may be processed using the calibrated exposure duration.

The Neutral Beam 1314 contains a repeatable fraction of the initial energy of the accelerated GCIB 1128. The remaining ionized portion 1316 of the original GCIB 1128 has been removed from the Neutral Beam 1314 and is collected by the grounded deflection plate 1304. The ionized portion 1316 that is removed from the Neutral Beam 1314 may include monomer ions and gas-cluster ions including intermediate size gas-cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions. As will be shown below, certain superior process results are obtained by processing workpieces using this Neutral Beam.

Figure 4:
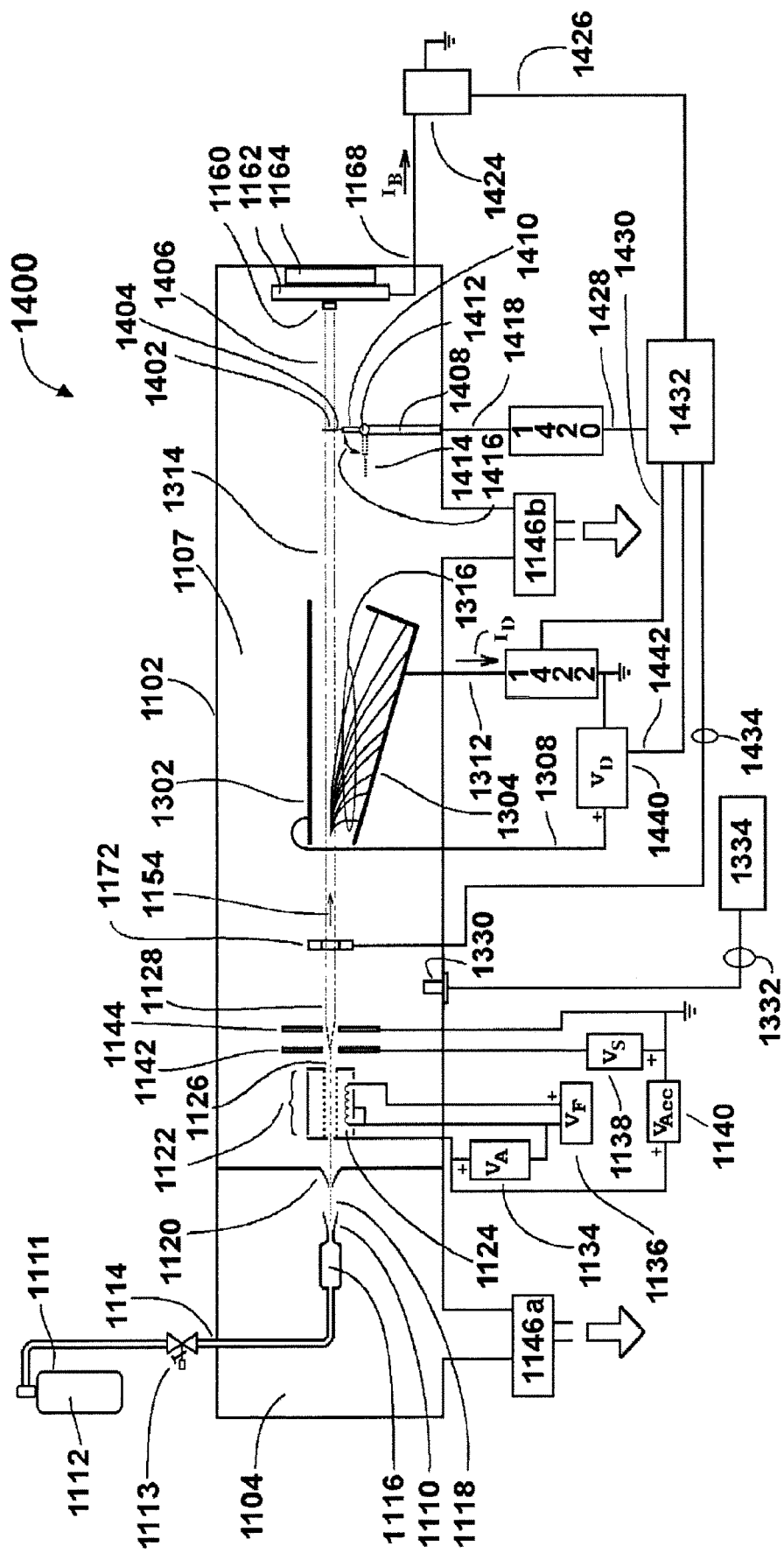
FIG. 4 is a schematic of a Neutral Beam processing apparatus 1400 using a thermal sensor for Neutral Beam measurement.

FIG. 4 is a schematic of a Neutral Beam processing apparatus 1400 as may, for example, be used in generating Neutral Beams as may be employed in embodiments of the invention. It uses a thermal sensor for Neutral Beam measurement. A thermal sensor 1402 attaches via low thermal conductivity attachment 1404 to a rotating support arm 1410 attached to a pivot 1412. Actuator 1408 moves thermal sensor 1402 via a reversible rotary motion 1416 between positions that intercept the Neutral Beam 1314 or GCIB 1128 and a parked position indicated by 1414 where the thermal sensor 1402 does not intercept any beam. When thermal sensor 1402 is in the parked position (indicated by 1414) the GCIB 1128 or Neutral Beam 1314 continues along path 1406 for irradiation of the workpiece 1160 and/or workpiece holder 1162. A thermal sensor controller 1420 controls positioning of the thermal sensor 1402 and performs processing of the signal generated by thermal sensor 1402. Thermal sensor 1402 communicates with the thermal sensor controller 1420 through an electrical cable 1418. Thermal sensor controller 1420 communicates with a dosimetry controller 1432 through an electrical cable 1428. A beam current measurement device 1424 measures beam current $I_B$ flowing in electrical lead 1168 when the GCIB 1128 strikes the workpiece 1160 and/or the workpiece holder 1162. Beam current measurement device 1424 communicates a beam current measurement signal to dosimetry controller 1432 via electrical cable 1426. Dosimetry controller 1432 controls setting of open and closed states for beam gate 1172 by control signals transmitted via linkage 1434. Dosimetry controller 1432 controls deflector power supply 1440 via electrical cable 1442 and can control the deflection voltage $V_D$ between voltages of zero and a positive voltage adequate to completely deflect the ionized portion 1316 of the GCIB 1128 to the deflection plate 1304. When the ionized portion 1316 of the GCIB 1128 strikes deflection plate 1304, the resulting current $I_D$ is measured by current sensor 1422 and communicated to the dosimetry controller 1432 via electrical cable 1430. In operation dosimetry controller 1432 sets the thermal sensor 1402 to the parked position 1414, opens beam gate 1172, and sets $V_D$ to zero so that the full GCIB 1128 strikes the workpiece holder 1162 and/or workpiece 1160. The dosimetry controller 1432 records the beam current $I_B$ transmitted from beam current measurement device 1424. The dosimetry controller 1432 then moves the thermal sensor 1402 from the parked position 1414 to intercept the GCIB 1128 by commands relayed through thermal sensor controller 1420. Thermal sensor controller 1420 measures the beam energy flux of GCIB 1128 by calculation based on the heat capacity of the sensor and measured rate of temperature rise of the thermal sensor 1402 as its temperature rises through a predetermined measurement temperature (for example 70 degrees C.) and communicates the calculated beam energy flux to the dosimetry controller 1432 which then calculates a calibration of the beam energy flux as measured by the thermal sensor 1402 and the corresponding beam current measured by the beam current measurement device 1424. The dosimetry controller 1432 then parks the thermal sensor 1402 at parked position 1414, allowing it to cool and commands application of positive $V_D$ to deflection plate 1302 until the entire current $I_D$ due to the ionized portion of the GCIB 1128 is transferred to the deflection plate 1304. The current sensor 1422 measures the corresponding $I_D$ and communicates it to the dosimetry controller 1432. The dosimetry controller also moves the thermal sensor 1402 from parked position 1414 to intercept the Neutral Beam 1314 by commands relayed through thermal sensor controller 420. Thermal sensor controller 420 measures the beam energy flux of the Neutral Beam 1314 using the previously determined calibration factor and the rate of temperature rise of the thermal sensor 1402 as its temperature rises through the predetermined measurement temperature and communicates the Neutral Beam energy flux to the dosimetry controller 1432. The dosimetry controller 1432 calculates a neutral beam fraction, which is the ratio of the thermal measurement of the Neutral Beam 1314 energy flux to the thermal measurement of the full GCIB 1128 energy flux at sensor 1402. Under typical operation, a neutral beam fraction of from about 5% to about 95% is achieved. Before beginning processing, the dosimetry controller 1432 also measures the current, $I_D$, and determines a current ratio between the initial values of $I_B$ and $I_D$. During processing, the instantaneous $I_D$ measurement multiplied by the initial $I_B/I_D$ ratio may be used as a proxy for continuous measurement of the $I_B$ and employed for dosimetry during control of processing by the dosimetry controller 1432. Thus the dosimetry controller 1432 can compensate any beam fluctuation during workpiece processing, just as if an actual beam current measurement for the full GCIB 1128 were available. The dosimetry controller uses the neutral beam fraction to compute a desired processing time for a particular beam process. During the process, the processing time can be adjusted based on the calibrated measurement of $I_D$ for correction of any beam fluctuation during the process.

Figure 5:
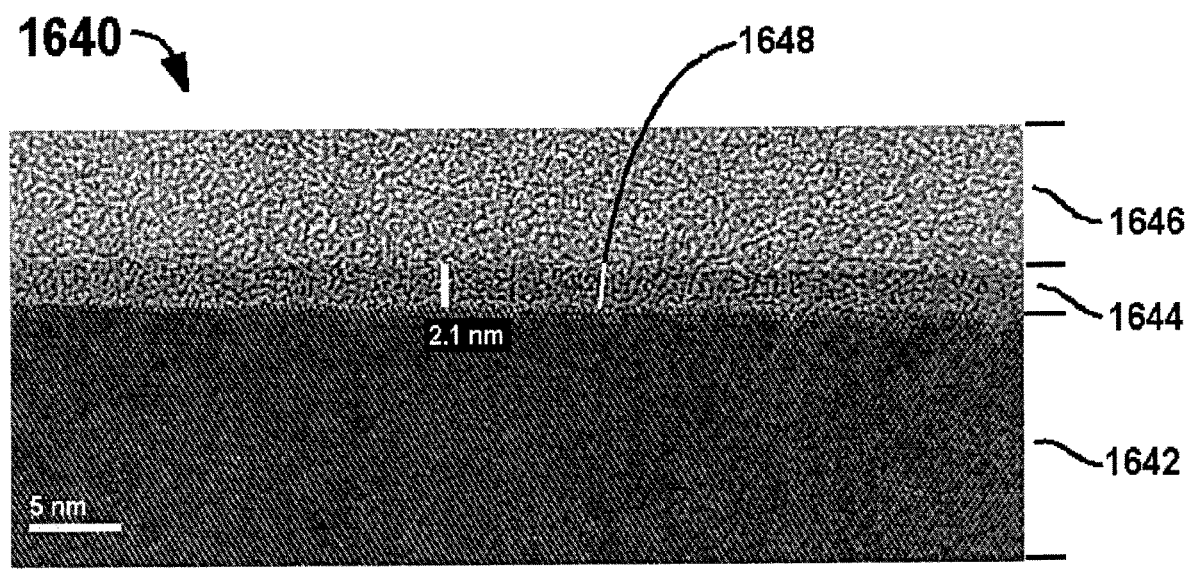
FIG. 5 is a TEM image illustrating the use of embodiments of the invention in forming a very thin modified layer in a material.

FIG. 5 is a TEM image 1640 illustrating production of a very shallow modified (amorphous) layer by irradiating with a dissociated, accelerated Neutral Beam derived from a GCIB. Native oxide forms spontaneously in air or water when bare silicon is exposed. A silicon wafer having a native oxide film was cleaned in 1% aqueous solution of hydrofluoric acid to remove the native oxide. The cleaned silicon substrate was irradiated using a dissociated Neutral Beam derived from a 30 kV accelerated GCIB (charged components removed from the beam by deflection) formed from argon. The irradiated dose was matched in energy to the total energy carried by a full beam (charged plus neutral) at an ion dose of $5 \times 10^{14}$ gas-cluster ions per cm$^2$ by using a thermal sensor to match the total energy deposited by the Neutral Beam to that of the full $5 \times 10^{14}$ gas-cluster ions per cm$^2$ beam. Prior to sectioning for TEM imaging, the top surface of the sample was coated with an epoxy overcoat to facilitate the sectioning operation and to avoid damage to the surface during the sectioning process. The TEM image 1640 shows the epoxy overcoat 1646, a 2.1 nm thick amorphous modified film 1644 in the surface of the silicon formed by the accelerated Neutral Beam irradiation, overlying the crystalline silicon substrate material 1642. A smooth interface 1648 having a peak-to-peak variation on an atomic scale was formed between the amorphous film 1644 and the underlying crystalline silicon material 1642, as a result of the irradiation process. This shows that the noble gas, argon (Ar), may be employed to form a very thin modified layer in a material. Behavior in polymers is similar to that in silicon, except for slight differences in film thickness due to the different beam stopping powers of silicon and polymers. Other gases than Argon may be used to form modified layers by employing them in formation of accelerated Neutral Beams for embodiments of the invention. However, in some cases noble gases such as Argon (Ar) and xenon (Xe) are preferred for converting polymer surface films since they are not chemically reactive and as such do not combine in an additive way with the constituents of the polymer. Other source gases may be used alone or in mixtures with argon or other noble gases. When the source gas or source gas mixture includes relatively refractory elements such as carbon (C) or silicon (Si) the refractory elements tend to become incorporated into the modified polymer film. Thus, for examples, methane ($CH_4$) or silane ($SiH_4$), alone or in mixture with a noble gas, may be used as a source gas to introduce C or Si into the modified polymer film to modify its properties when desirable. In FIG. 5, the lead line connecting the numeric designator 1648 to its object changes color to maintain contrast on regions in the figure having differing backgrounds.

Figure 6A:
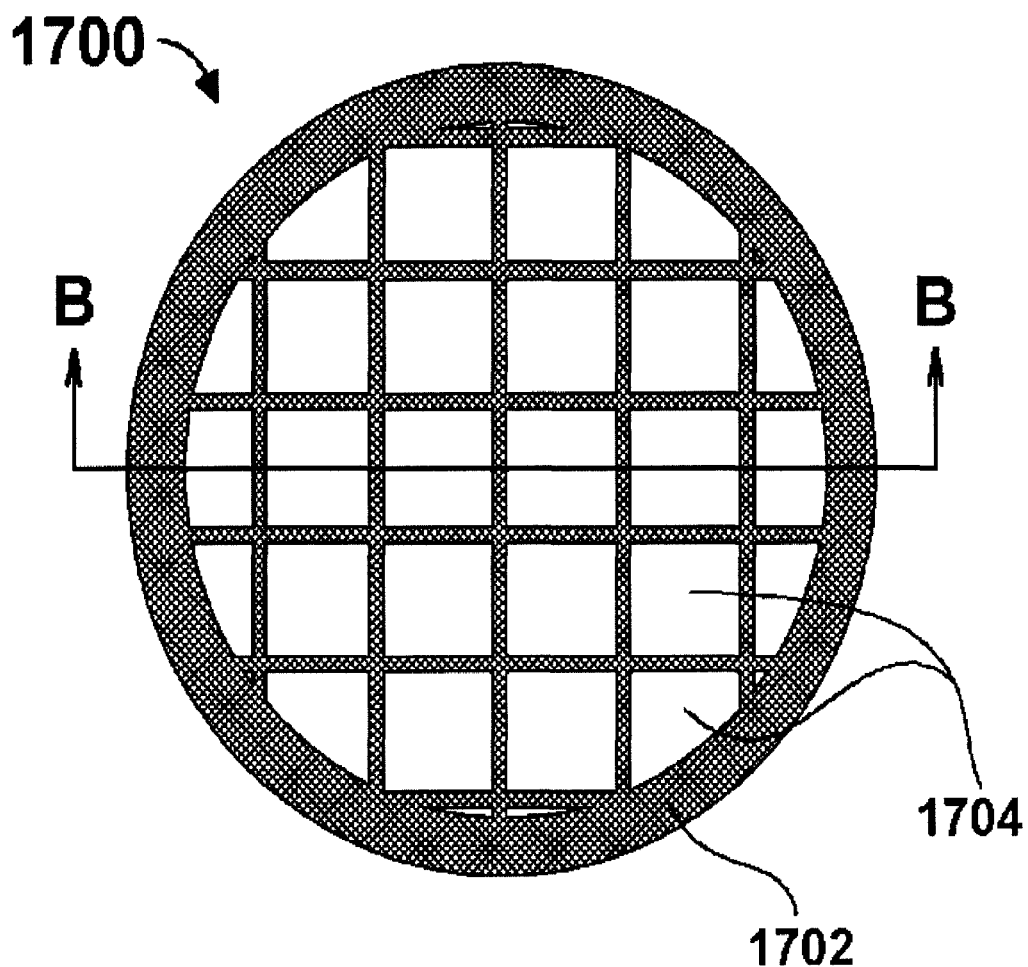
FIGS. 6A and 6B are views of a TEM grid.

FIG. 6A shows a view 1700 of a typical commercially available TEM grid of a type used to provide support for holding samples for TEM imaging. The TEM grid 1702 is typically made of metal, for example copper, gold, nickel, etc. Other materials may also be used. They are typically about 3 mm in diameter and have a mesh with openings 1704 of selectable size of from about 20-500 micrometers square. Some have hexagonal or other shaped openings.

Figure 6B:
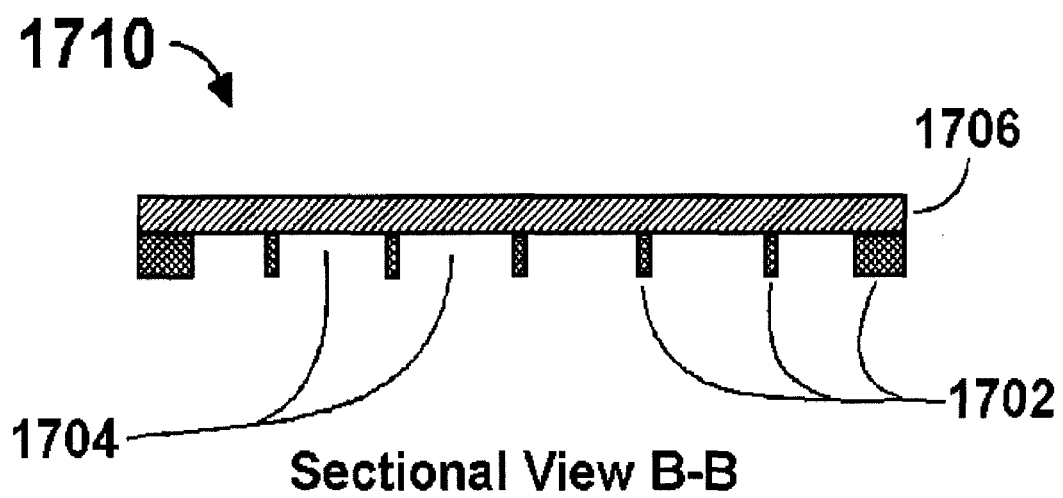

FIG. 6B shows a cross-sectional view 1710 of the TEM grid 1700 seen along sight lines B-B. Referring again to FIG. 6B, the TEM grid 1702 is indicated with openings 1704. Also shown is a conventional support membrane 1706. The thicknesses of the TEM grid 1702 and the support membrane 1706 are not necessarily shown to scale. Typical prior art support membranes 1706 may be for examples poly(vinyl formal), graphene, lacey carbon film, etc. Poly(vinyl formal) support membranes may typically have a thickness, for example, of about 30-60 nm.

FIGS. 7A through 7D are sectional views showing steps in preparation of a TEM grid with improved membrane for supporting an object for TEM imaging, according to embodiment of the invention. The TEM grid and the associated membrane layers are not shown to scale in relative thicknesses.

Figure 7A:
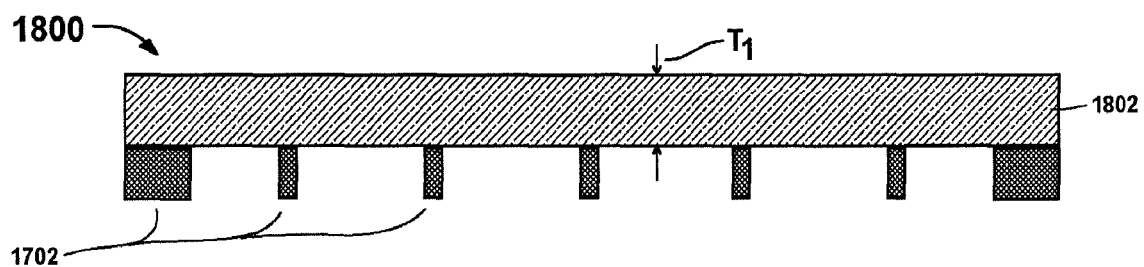
FIGS. 7A through 7D are sectional views showing steps in preparation of a TEM grid with improved membrane for supporting a subject for TEM imaging, according to embodiments of the invention.

FIG. 7A shows a view 1800 of a TEM grid 1702 with a starting membrane 1802 of a poly(vinyl formal) material (SPI Supplies/Structure Probe, Inc., 569 East Gay St, West Chester, Pa. 19380, Product number 02463-MB, SPI-Chem™ FORMVAR® Resin for Electron Microscopy). Poly(vinyl formal) is comprised of C, O, and H elements and is solid in polymer form, but may be placed into solution as a liquid. A solution of the poly(vinyl formal) in chloroform, 1,2-dichloroethane, dioxane, or other suitable solvent may be used to form the starting membrane 1802 by solvent evaporation on a smooth surface, or by spin-forming on a conventional spin coating device. The starting membrane 1802 need not be particularly thin (and has a thickness $T_1$, of for example from a few nm to about 100 nm) nor particularly uniform in thickness, and thus is readily and inexpensively fabricated. Following membrane formation, it is transferred to the TEM grid 1702, as shown. In some cases the starting membrane 1802 may attach satisfactorily to the TEM grid 1702 by molecular attraction, but in general it is preferred that the starting membrane be adhered to the TEM grid 1702.

Figure 7B:
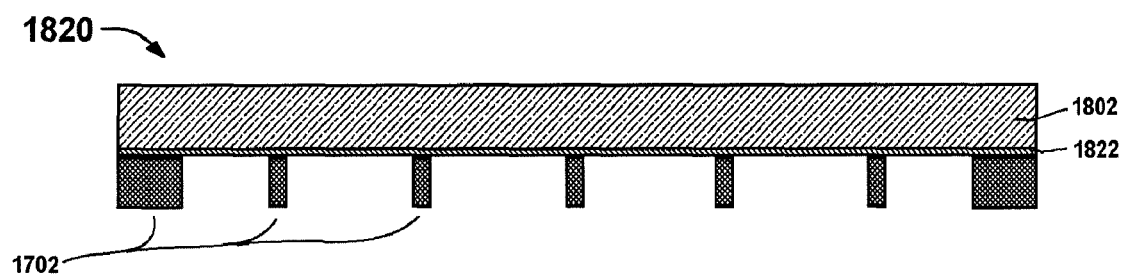

FIG. 7B shows a view 1820 of a TEM grid 1702 wherein the starting membrane 1802 is adhered to the TEM grid 1702. An optional adhesive layer 1822, adheres the starting membrane 1802 to the TEM grid 1702. The adhesive layer 1822 may be a conventional adhesive selected for the purpose or may be the result of a wetting of a surface of the starting membrane 1802 with chloroform, 1,2-dichloroethane, dioxane, or other suitable solvent to cause it to soften and become adhesive to the TEM grid 1702.

Figure 7C:
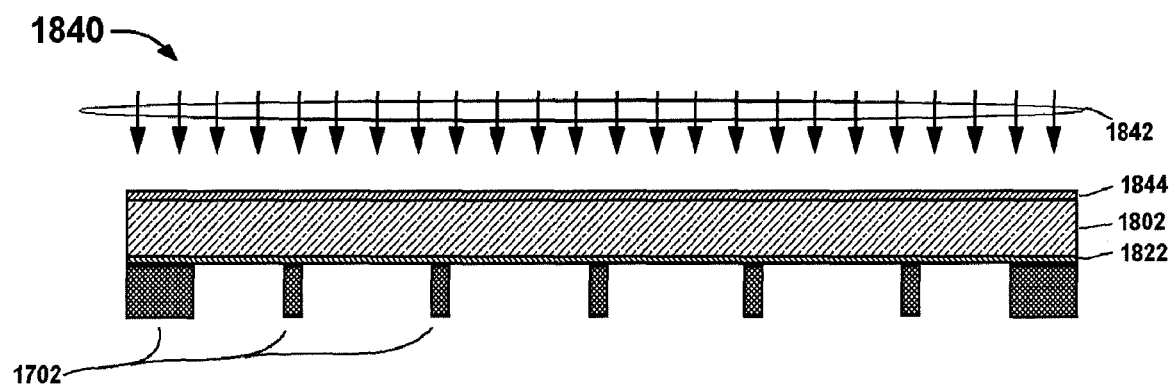

FIG. 7C shows a view 1840 of the TEM grid 1702 with starting membrane 1802 attached by cured (or solvent evaporated) adhesive layer 1822. The TEM grid/membrane assembly is now disposed in a Neutral Beam processing apparatus and irradiated with a dissociated Neutral Beam 1842 derived from an accelerated GCIB. The irradiation forms a modified surface layer 1844. In this example, the modified surface layer 1844 is formed by irradiation with a dissociated Neutral Beam derived from an accelerated GCIB (charged components removed from the beam by deflection). The source gas was Argon, the acceleration potential was 7 kV, and the irradiated Neutral Beam dose was matched in energy to the total energy carried by a full GCIB beam (charged plus neutral) at an ion dose of $5 \times 10^{14}$ gas-cluster ions per cm$^2$ by using a thermal sensor to match the total energy deposited by the Neutral Beam to that of the full $5 \times 10^{14}$ gas-cluster ions per cm$^2$ beam. The resulting thickness of the modified surface layer 1844 was 3 nm. After irradiation, the assembly is removed from the Neutral Beam processing apparatus. The modified surface layer 1844 has reduced content of the volatile elements O and H, and is carbon-rich. The loss of O and H creates a modest tensile force in the modified surface layer 1844, and the carbonization denatures the polymer so as to render it no longer soluble in the typical solvents for poly(vinyl formal).

Figure 7D:
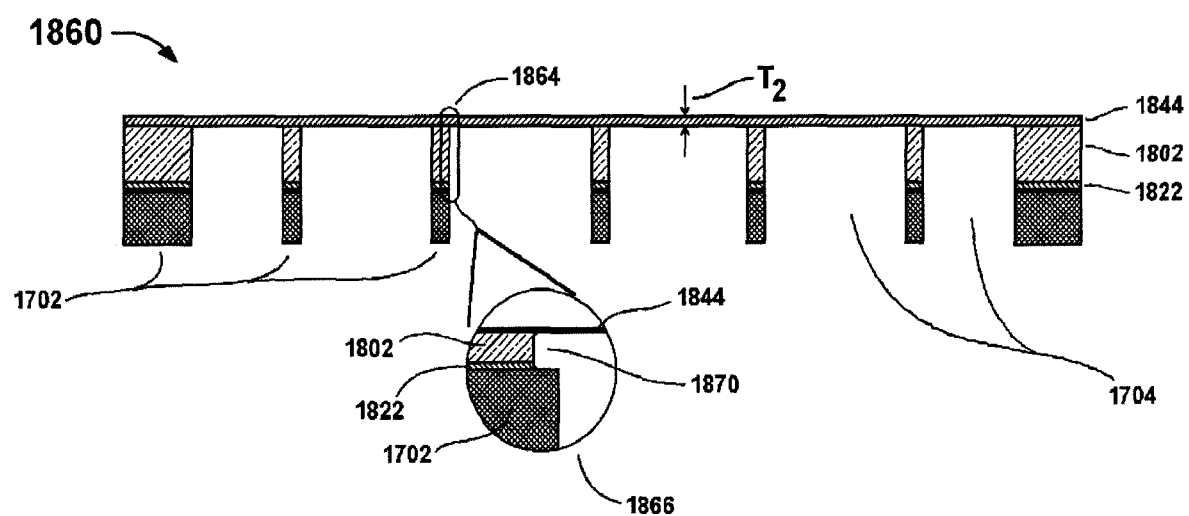

FIG. 7D is a view 1860 of the TEM grid following solvent treatment to remove unmodified remnants of the starting membrane 1802 after formation of the modified surface layer 1844. Treatment with chloroform, 1,2-dichloroethane, dioxane, or other suitable solvent dissolves unmodified starting membrane 1802 remnants through openings 1704, stopping at the modified surface layer 1844, leaving it as a free-standing membrane of thickness $T_2$, in this example 2 nm. Because of the tensile force in the modified surface layer 1844, and the fact that it is anchored to the TEM grid 1702 by un-dissolved adhesive layer 1822 and un-dissolved remnant of the starting membrane 1802. Recalling that in FIGS. 7A-7D the TEM grid and the associated membrane layers are not shown to scale in relative thicknesses, an enlarged view 1866 of the non-scale region 1864 is shown. Enlarged view 1866 is more nearly to scale, and clarifies that the individual support elements of the TEM grid 1702 are actually very wide relative to the thickness $T_1$ of the starting membrane 1802. Thus the solvent dissolution of the unirradiated portion of the starting membrane 1802 proceeds until it stops on the insoluble modified surface layer, but results in only negligible undercutting of the adhesive layer 1822 and the unirradiated portion of the starting membrane 1802 in the region of attachment to the TEM grid 1702. The TEM grid 1722 remains well adhered to the modified surface layer 1844, leaving it as a free-standing membrane tautly suspended between TEM grid 1722 anchor points. The carbon-rich free-standing membrane is sufficiently electrically conductive to avoid charging problems during electron bombardment for TEM imaging.

When a very thin freestanding membrane is desired, the modification of the surface layer 1844 is preferably formed by irradiation with a dissociated Neutral Beam derived from an accelerated GCIB (charged components removed from the beam by deflection) as described above. However, in certain applications thicker freestanding membranes may be desired or required (for greater strength and/or robustness or for different optical properties, for examples). In such cases, accelerated GCIB's may be employed for modifying the surface of the starting membrane. The inherently greater processing depth of the GCIB may be employed to modify surface layers to a depth of from a few tens of nanometers to several hundred nanometers (20 nm to 500 nm), depending on choice of gas-cluster ion sizes and/or acceleration potential. GCIB doses for surface layer modification may be, for example, on the order of about $5\times10^{14}$ gas-cluster ions per cm$^2$.

Using an accelerated GCIB or a dissociated Neutral Beam derived from an accelerated GCIB, various final freestanding or unsupported film thicknesses can be achieved by choice of beam type, acceleration potentials, irradiated doses, and/or selection of source gas. By routine experimentation and optimization, a wide variety of freestanding films of different thicknesses and properties may be formed.

For each different polymer or other starting material, the thickness of the resulting free-standing film is a function of the dose and energy of the irradiating Neutral Beam or GCIB and the stopping power of the starting membrane material. For other starting membrane materials, the dose and energy may be optimized with respect to desired membrane thickness by routine experimentation with beam parameters.

One exemplary alternative starting polymer material is polydimethylsiloxane, a polymer compound comprised of C, Si, O, and H elements and which may be formed into a solid thin film. In this example, the modified surface layer formed by irradiation with a dissociated Neutral Beam derived from an accelerated GCIB formed using Argon with similar beam conditions as described above, yields a modified surface layer similar to that described above, except that following irradiation, the modified surface layer has reduced content of the volatile elements O and H, and is carbon- and silicon-rich. Optionally, a dissociated Neutral Beam derived from an accelerated silicon-containing GCIB (as for example derived from a silane source gas or a silane-argon mixture source gas) may be employed in place of the previously described argon source gas to produce enrichment of the silicon content in the carbon- and silicon-rich modified surface layer thus formed. A suitable solvent (for example tert-butyl alcohol or an aliphatic hydrocarbon) may be employed to remove the unmodified portion of the original polydimethylsiloxane starting film, leaving the very thin free standing carbon-silicon film as analogous to the carbon film described above. For a thicker free standing carbon-silicon film, a GCIB or silicon-containing GCIB could be employed.

Figure 8:
FIG. 8 is a sectional view of a pellicle for protecting a photomask or a reticle according to embodiments of the invention.

FIG. 8 is a sectional view 1900 of a pellicle for protecting a photomask or a reticle according to embodiments of the invention. A very thin modified surface layer 1904 forms a membrane attached to a pellicle holder 1902 to serve as a pellicle. The free-standing membrane consists of the modified surface layer 1904, fabricated and adhered to a pellicle holder 1902, having been fabricated as described above in relation to a TEM grid support membrane at the discussion of FIGS. 7A-7D, with a pellicle holder 1902 replacing the TEM grid 1702. The very thin film is highly transparent and adds minimal optical effects. Use of various starting polymer starting materials, and/or different accelerated Neutral Beam source gases may be used to influence the optical characteristics of the final thin film.

Although the invention has been described, for exemplary purposes, as using a Neutral Beam derived from an Argon GCIB for processing a poly(vinyl formal) starting membrane and a polydimethylsiloxane starting film and for argon and silicon-containing source gases, it is understood by the inventors that benefits obtained by application of such surface processing is not limited to that specific starting material or those specific source gas materials and that the invention may be used for successful processing of other polymers including silicones and other materials and by using a wide range of source gases and gas mixtures suitable for forming gas-cluster ion-beams from which accelerated Neutral Beams can be derived, and it is intended that all such applications are included within the scope of the invention. Additionally, it is understood by the inventors that the invention is suitable for producing high uniformity membranes and films in applications other than TEM support films and pellicle films, and it is intended that all such applications are included within the scope of the invention.

Masking can be used to create free-standing membrane material that is not suspended by a frame (partial grid membrane) etc. or to accommodate other application needs. The membrane thickness may be further modified by processing the converted material with a Neutral Beam or GCIB that contains oxygen or other reactive species gas to reduce membrane thickness and/or to pattern the membrane layer. Further, if greater thickness is desired, the membrane thickness may be increased by adding a carbon-bearing or other relatively refractory constituent gas to the Neutral Beam or GCIB beam used for processing to deposit further thickness of similar or dissimilar materials. Multilayer devices can be fabricated in this manner by adding layers of material with a Neutral Beam or GCIB beam, or by converting additional added layers of polymer or other material and then converting with the Neutral Beam or GCIB or other energetic particle technology. Additional layers may also be added via separate deposition apparatus like a magnetron etc. Further, these layers can be patterned using known techniques to create free-standing membrane devices with multiple uses. Also, free-standing membranes may be annealed in vacuum or other environment to change their structure, composition (reactive environment) etc. and further modify their usefulness.

Although the invention has been described with respect to various embodiments, it should be realized that this invention is also capable of a wide variety of further and other embodiments within the spirit and scope of the invention.

The invention claimed is:

1. A method of forming a film comprising the steps of:
providing a starting layer of a starting material, the starting layer having opposed first and second surfaces and an initial, thickness, T1, thicker than a desired final film thickness, T2;
providing a support layer having an opening;
supporting the starting layer on the support layer, suspending the first surface across the opening;
irradiating a portion of the second surface over the opening with a non-photonic, accelerated energetic particle beam to modify the irradiated surface portion to a depth of thickness T2; and
treating the first surface of the irradiated starting layer with a solvent to remove unmodified starting material and to leave a film of thickness T2 over at least a portion of the opening.

2. Tire method of claim 1, wherein the step of supporting the first surface of the starting material includes attaching the first surface of the support layer along the first surface.

3. The method of claim 2, wherein the attaching step attaches the first surface to the membrane support layer by molecular attraction or by the use of an adhesive or a solvent.

4. The method of claim 1, wherein the step of irradiating uniformly irradiates the said portion of tire second surface portion.

5. A method of forming a film comprising the steps of:
providing a starting layer of a starting material, the starting layer having opposed first and second surfaces and an initial thickness, T1, thicker than a desired final film thickness, T2;
providing a support layer having an opening;
supporting the starting layer on the support layer, suspending the first surface across the opening;
irradiating a portion of the second surface over the opening with a non-photonic, accelerated energetic particle beam to modify the irradiated surface portion to a depth of thickness T2;
treating the first surface of the irradiated starting layer with a solvent to remove unmodified starting material and to leave a film of thickness T2 over at least a portion of the opening; and
wherein the thickness, T2, is in the range of from 20 inn to 500 nm.

6. A method of forming a film comprising the steps of:
providing a starting layer of a starting material, the starting layer having opposed first and second surfaces and an initial thickness, T1, thicker than a desired final film thickness, T2;
providing a support layer having an opening;
supporting the starting layer on the support layer, suspending the first surface across the opening;
irradiating a portion of the second surface over the opening with a non-photonic, accelerated energetic particle beam to modify the irradiated surface portion to a depth of thickness T2;
treating the first surface of the irradiated starting layer with a solvent to remove unmodified starting material and to leave a film or thickness T2 over at least a portion of the opening; and
wherein the energetic particle beam is a dissociated neutral beam formed horn an accelerated gas-cluster ion beam and the thickness, T2, is less than 5 nm.

7. The method of claim 6, wherein the thickness, T2 is less than or equal to 3 nm.

8. The method of claim 6, wherein the starting material is a polymer.

9. The method of claim 8, wherein the polymer is poly (vinyl formal) or polydimetlryisiloxanc.

10. The method of claim 8, wherein die solvent comprises any of the group consisting of chloroform, 1,2-dichloroethane, dioxane, tent-butyl alcohol, and an aliphatic hydrocarbon.

11. The method of claim 6, wherein the support layer is a TEM grid or a pellicle support.

12. The method of claim 6, wherein the energetic beam comprises atoms of any of the group consisting of argon, xenon, carbon, oxygen, and silicon.

13. The method of claim 6, wherein the film is carbon enriched or silicon enriched by the step of irradiating.

14. A method of forming a film comprising the steps of:
providing a starting, layer of a starting material, the starting layer having opposed first and second surfaces and an initial thickness, T1, thicker than a desired final film thickness, T2;
irradiating at least a portion of the second surface with a non-photonic accelerated energetic particle beam to modify the irradiated surface portion to a depth of thickness T2; and
treating the first surface of the irradiated starting layer with a solvent to remove unmodified starting material and to leave a film of thickness T2 over at least a portion of the starting layer.

* * * * *